Oct. 1, 1968 L. A. KAPLAN ET AL 3,404,347
GAIN CONTROLLED AMPLIFIER USING MULTIPLE GATE FIELD-EFFECT TRANSISTOR AS THE ACTIVE ELEMENT THEREOF
Filed Nov. 3, 1966
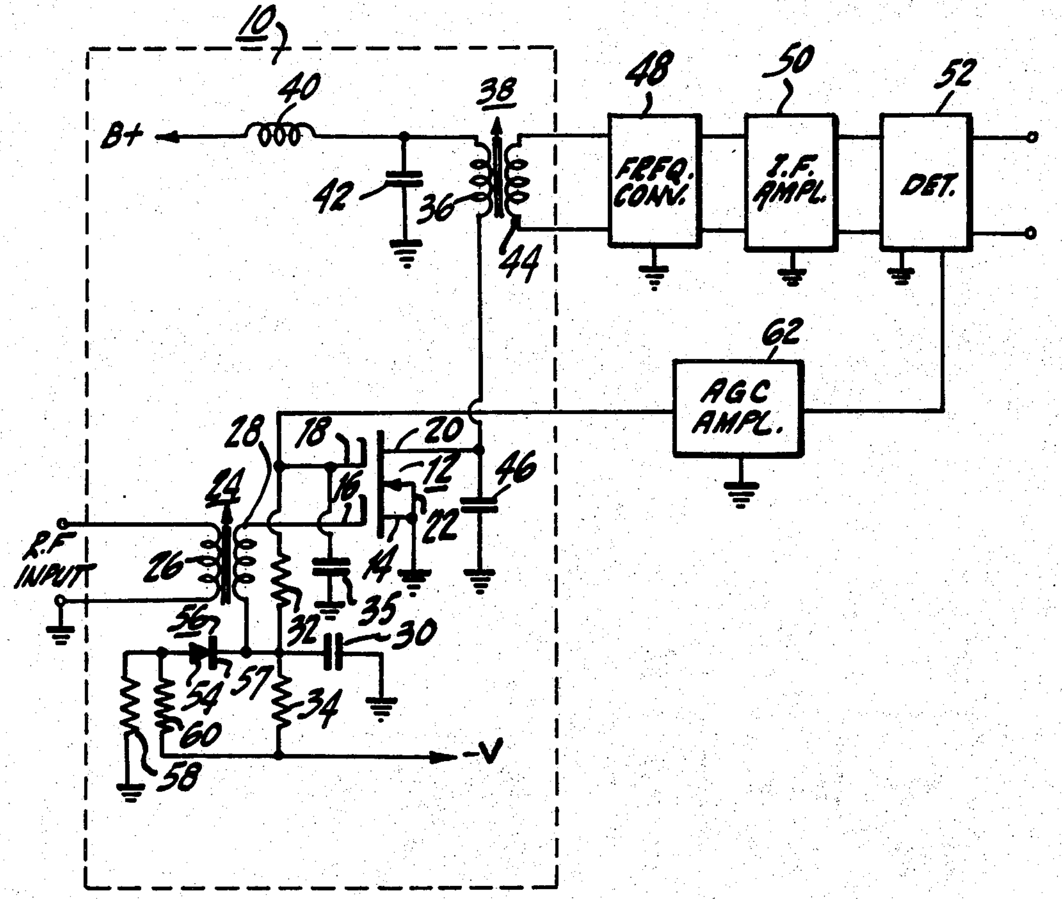
INVENTORS:
Leonard Kaplan & O. Philip Hart
By Eugene M. Whitacre
Attorney United States Patent Office 3,404,347
Patented Oct. 1, 1968

3,404,347

GAIN CONTROLLED AMPLIFIER USING MULTIPLE GATE FIELD-EFFECT TRANSISTOR AS THE ACTIVE ELEMENT THEREOF

Leonard A. Kaplan, Fords, and Oliver P. Hart, Berkeley Heights, N.J., assignors to Radio Corporation of America, a corporation of Delaware Filed Nov. 3, 1966, Ser. No. 591,821
9 Claims. (Cl. 330—29)

This invention relates in general to gain controlled amplifiers and more particularly to gain controlled amplifiers using multiple gate field-effect transistors as the active elements thereof.

Multiple gate field-effect transistors, such as tetrode transistors, are field-effect transistors having two or more gate electrodes in addition to the source and drain electrodes. These transistors have attractive characteristics which appear to be promising for many circuit applications. Some of these characteristics are: (1) high input impedance, (2) low cross-modulation, and (3) low noise, (4) simplified direct coupling capability, and (5) compatibility with integrated circuit techniques.

In using a multiple gate tetrode transistor, for example, as a gain controlled radio frequency (R.F.) or intermediate frequency (I.F.) amplifier, it is desirable to apply the R.F. or I.F. signal to the first gate and the AGC voltage to the second gate. However, AGC voltage applied to the second gate causes the first gate input capacitance to change. This results in a change of the tuning of the signal input circuit connected to the first gate electrode causing a bandpass frequency shift.

Accordingly, it is an object of this invention to provide an improved gain controlled amplifier employing a field-effect transistor having two or more gate electrodes.

It is another object of this invention to provide an improved gain controlled amplifier circuit employing a field-effect transistor in which the input capacity between the signal input gate and common electrode is essentially unaffected by the variable gain action of the circuit.

It is still another object of the present invention to provide an improved gain controlled amplifier employing a multiple gate field-effect semiconductor device in which bandpass frequency shifting caused by changes in the device input capacitance due to changes in an applied AGC voltage are substantially reduced.

An amplifier circuit embodying the invention includes a multiple gate field-effect transistor having source, drain and first and second gate electrodes. The first gate and source electrodes are coupled to a signal input circuit and the drain and source electrodes are coupled to a signal output circuit. A gain controlling potential is applied to the second gate electrode to cause the gain of the amplifier circuit to change as a function of the amplitude of the gain controlling potential. In addition, a portion of the gain controlling potential is applied to the first gate electrode to neutralize any change in the device input capacitance due to the application of gain controlling potential to the second gate electrode.

The novel features which are considered characteristic of the invention are set forth with particularity in the appended claims. The invention itself, however, both as to its organization and method of operation, as well as additional objects and advantages thereof, will best be understood from the following description when read in connection with the accompanying drawing in which a schematic circuit diagram of a radio frequency amplifier embodying the invention is illustrated.

Referring now to the drawing, a gain controlled radio frequency amplifier 10 includes a field-effect tetrode transistor 12 having source, first gate, second gate, and drain electrodes 14, 16, 18 and 20 respectively and a substrate electrode 22. In the illustrated embodiment, the field-effect transistor 12 is of a type referred to as an N-channel insulated gate tetrode transistor.

Transistor 12 is connected in common source configuration with the substrate electrode 22 and the source electrode 14 connected to ground. An R.F. signal to be amplified is coupled through a coupling transformer 24 to the first gate electrode 16 of the transistor 12. The transformer primary and secondary windings 26 and 28 may be single tuned to resonate with the stray input capacitance (not shown) of the first gate electrode 16 at the desired signal frequency. The end of the secondary winding 28 remote from the first gate electrode 16 is coupled to ground through a signal bypass capacitor 30. Connection is also made from said end of the transformer secondary winding 28 to the junction of a pair of resistors 32 and 34 serially connected between the second gate electrode 18 and a source of negative potential V. The second gate electrode 18 is also coupled to ground through a signal bypass capacitor 35.

The drain electrode 20 is coupled through the primary winding 36 of an output signal coupling transformer 38 in series with a signal de-coupling choke 40 to a source of fixed operating potential B+. Choke 40 is bypassed to ground at signal frequencies by a capacitor 42. As shown, the transformer primary winding 36 serves as an A.C. load impedance and the B+ potential provides the operating potential supply means for establishing drain-to-source current flow in the transistor 12. The signal output transformer 38 primary and secondary windings 36 and 44 may be tuned by a capacitor 46 connected between the drain electrode 20 and ground to resonate at the desired signal frequency. The signal developed across the transformer secondary 44 is then translated through a frequency converter 48, I.F. amplifier 50, and a detector 52.

The anode electrode 54 of a diode 56 is coupled to ground through a resistor 58, and to the source of negative potential V through a resistor 60. The diode cathode electrode 57 is connected to the junction of resistors 32 and 34. As will be hereinafter described, the diode 34 acts as a clamp to prevent an AGC voltage applied to the first gate electrode 18 from exceeding a desired value.

An AGC amplifier 62 providing a source of direct automatic grain control voltage is coupled to the second gate electrode 18 and to the first gate electrode 16 via the voltage dividing resistors 32 and 34. The AGC amplifier 62 which is driven by the detector 52 provides a direct control voltage, the magnitude of which increases in the negative direction as a function of the strength of R.F. input signal being applied to the field-effect transistor 12.

It will be noted that for the circuit shown and having the representative component values to be hereinafter tabulated, initial operating bias potential at the gate electrodes 16 and 18 are provided by the negative potential source V and a positive reference control voltage from the AGC amplifier 62 operating through resistors 32 and 34 and the transformer secondary winding 28.

When an AGC control voltage is applied to the second gate electrode of an insulated gate field-effect tetrode transistor operating as a signal amplifier, the input capacitance of the first gate electrode will change. Since the device input capacitance is taken into consideration when designing an amplifier, as for example in the present embodiment wherein the device input capacitance is utilized in the tuning of the signal input transformer, a change in the device input capacitance will produce a change in the frequency selective or bandpass characteristics of the amplifier.

However, in the circuit shown in the drawing, and more particularly due to the application to the first control gate of a portion of the feedback AGC control voltage, the input capacitance of the first gate electrode remains virtually unaffected by the AGC action of the amplifier.

Initially the polarity and magnitude of the control voltage supplied by the AGC amplifier 62 and the magnitude of the voltage from the negative source V are such that the combined voltage applied to the second gate electrode 18 is positive with respect to the combined voltage applied to the first gate electrode 16. At this time, the transistor 12 is biased to provide maximum gain and the AGC control voltage divides between the transistor first and second gate electrodes respectively at a ratio of about 10:1. In the case of an RCA TA2644 tetrode transistor, for example, this ratio of applied control voltages has been found to effect an almost constant input capacitance at the first gate electrode over a selected first range of AGC control voltages.

The operation of the circuit shown in the drawing is as follows. Over the first range of control voltages corresponding to relatively weak signal levels, as the level of the applied input signal to the amplifier increases, the level of the control voltage fed to the second gate electrode 18 from the AGC amplifier 62 goes more negative, thus effecting a desired amplifier gain reduction. However, with a more negative voltage applied to the second gate electrode, the voltage fed to the first gate electrode also becomes proportionately more negative. The effect of this action is to neutralize changes in the input capacitance of the first gate electrode due to the application of the AGC control voltage to the second gate electrode.

As the control voltage goes still more negative corresponding to larger signal levels, above the first range of AGC voltages, a point is reached where additional negative voltage applied to the first gate electrode 16 may cause the input capacitance thereof to change in value. In the embodiment shown, this change in capacitance is minimized by the addition of the diode clamping network, (diode 56, and resistors 58 and 60). Initially the diode 56 is reverse biased by the AGC voltage and negative control source V to inhibit current flow. As the control voltage goes more negative the reverse bias across the diode decreases. At the level in which the control voltage exceeds the aforesaid first range, the diode reverse bias is overcome, thus effectively connecting the first gate electrode to the junction of resistors 58 and 60, so as to cause the voltage developed across the resistor 58 due to the potential source V plus the small voltage dropped across the diode itself to be applied to the first gate electrode 16. As a result, the first gate electrode is clamped to a desired voltage for further increases in the AGC voltage, and the gain of the stage 10 is reduced by the action of this voltage on the second gate electrode 18.

Thus, a gain controlled amplifier employing a tetrode transistor as the active element thereof has been provided in which changes in the transistor input capacitance associated with the application of a first control voltage to the second gate electrode of the transistor to reduce the gain thereof, are neutralized by the application of a second control voltage of like polarity to the transistor first gate electrode.

A particular set of values for the embodiment shown in the drawing which has provided satisfactory operation are set forth below. It will be appreciated that these values are given by way of example only.

| | |
|---|---|
| Transistor **12** (RCA developmental type) | TA2644 |
| Capacitor **30** ____ microfarads | 0.001 |
| Capacitor **42** ____ do | 0.001 |
| Capacitor **46** ____ picofarads | 10 |
| Resistor **32** ____ megohms | 1 |
| Resistor **34** ____ ohms | 110,000 |
| Resistor **58** ____ do | 5,100 |
| Resistor **60** ____ do | 1,000 |
| Choke **40** ____ microhenries | 4.7 |
| Diode **56** | IN3754 |
| V ____ volts | −3.7 |
| B+ ____ do | +15 |

It is to be understood that a P-channel field-effect tetrode transistor could be utilized in place of the N-channel transistor shown, with corresponding changes in the polarity of the operating potential and bias potential source V.

It will be further understood that the principles disclosed herein are applicable to amplifier circuits empolying field-effect semiconductor devices having more than two gate electrodes.

What is claimed is:

1. A signal translating circuit comprising:

a semiconductor field-effect device having source, drain and at least two gate electrodes;

circuit means coupled between one of said gate electrodes and said source electrode providing a signal input circuit;

circuit means coupled between said drain and source electrodes providing a signal output circuit;

gain controlling potential means coupled to the other of said gate electrodes for controlling the gain of said signal translating circuit as a function of the amplitude of said gain controlling potential; and means coupling a portion of said gain controlling potential to said one gate electrode to neutralize any change in the device input capacitance due to the application of said gain controlling potential to said other gate electrode.

2. A signal translating circuit as defined in claim 1 wherein said one gate electrode is physically closer to said source electrode than said other gate electrode.

3. A signal translating circuit as defined in claim 2 and further including means including a diode coupled to said one gate for limiting the magnitude of said gain controlling potential portion to a predetermined level.

4. In an amplifier circuit of the type including a field-effect transistor having source, drain, and a plurality of gate electrodes, means coupled between one of said gate electrodes and said source electrode providing a tuned signal input circuit, and means coupled between the drain and source electrodes providing a tuned signal output circuit, the improvement comprising:

gain controlling potential means coupled to another of said gate electrodes for controlling the gain of said amplifier circuit as a function of the amplitude of said gain controlling potential; and circuit means coupling a portion of said gain controlling potential to said one gate electrode.

5. An amplifier circuit as defined in claim 4 wherein said circuit means includes a diode coupled to said one gate electrode and biased for limiting the magnitude of said gain controlling potential portion applied thereto to a predetermined level.

6. A gain controlled amplifier comprising:

an insulated gate field-effect transistor having source, drain, and first and second gate electrodes;

means coupled between said first gate and source electrodes providing a signal input circuit for applying an input signal;

means coupled between said drain and source electrodes providing a signal output circuit;

automatic gain control means coupled to said second gate electrode for applying a control voltage thereto of a polarity that tends to decrease the gain of said amplifier as the level of said input signal increases;

means coupling a portion of said control voltage to said first gate electrode, said means also limiting the magnitude of said portion of said control voltage applied to said first gate electrode to a predetermined level so as to neutralize any change in the input capacitance of the first gate electrode due to the application of said control voltage to said second gate electrode.

7. A gain controlled amplifier as defined in claim 6 wherein said first gate electrode is physically closer to said source electrode than said second gate electrode.

8. A circuit for controlling the gain and stabilizing the input capacitance of an amplifier comprising:

an insulated gate field-effect transistor having source, drain and first and second gate electrodes;

signal input circuit means coupled between the first gate and source electrodes of said transistor, said input circuit means being tuned to a desired frequency passband by the input capacitance of said amplifier;

signal output circuit means coupled between the drain and source electrodes of said transistor;

means providing a source of gain controlling potential for controlling the gain of said amplifier and which increases in a predetermined polarity direction as the level of said input signal increases;

means coupling said source of gain controlling potential to said second gate electrode, and a portion of said gain controlling potential to said first gate electrode;

a source of bias potential; and means including a diode coupled between said first gate electrode and source of bias potential so that said diode is initially reverse biased, but increases in said gain controlling potential in said polarity direction reduces said reverse bias over a first range of said gain controlling potential and forward biases said diode over a second range of said gain controlling potential such that the portion of gain controlling potential coupled to said first gate electrode remains substantially constant over said second range of gain controlling potential.

9. A signal translating circuit as defined in claim 8 wherein said first gate electrode is physically closer to said source electrode than said second gate electrode.

References Cited

Sherwin: "Need High $Z_{in}$ and Low $C_{in}$? Turn to the Tetrode FET and HF Design," Electronic Design, vol. 13, No. 12, June 7, 1965, pp. 20–25.

ROY LAKE, *Primary Examiner.*

JAMES B. MULLINS, *Assistant Examiner.*